United States Patent
Murzin et al.

(10) Patent No.: US 6,328,804 B1
(45) Date of Patent: *Dec. 11, 2001

(54) CHEMICAL VAPOR DEPOSITION OF METALS ON A SPHERICAL SHAPED SEMICONDUCTOR SUBSTRATE

(75) Inventors: Ivan Herman Murzin, Garland; Jeffrey Ned Miller, Dallas; Ajay Tapiawala, Garland, all of TX (US)

(73) Assignee: Ball Semiconductor, Inc., Allen, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 09/313,554

(22) Filed: May 14, 1999

Related U.S. Application Data (63) Continuation-in-part of application No. 09/113,671, filed on Jul. 10, 1998.

(51) Int. Cl.[7] .................................................. C23C 16/00
(52) U.S. Cl. ...................... 118/715; 118/723 R; 118/716; 438/687; 438/681; 438/677
(58) Field of Search .................................... 438/687, 688, 438/680, 676, 681, 677; 118/715, 725, 723 R, 716

(56) References Cited

U.S. PATENT DOCUMENTS

| | | | |
|---|---|---|---|
| Re. 31,473 | 12/1983 | Kilby et al. ................. | 425/6 |
| 5,571,366 | 11/1996 | Ishii et al. ................. | 156/345 |
| 5,635,423 | 6/1997 | Huang et al. . | |
| 5,736,457 | 4/1998 | Zhao . | |
| 5,801,094 | 9/1998 | Yew et al. . | |
| 5,810,934 * | 9/1998 | Lord et al. ................. | 118/725 |
| 6,015,464 | 1/2000 | Xia et al. ................. | 118/715 |
| 6,041,735 | 3/2000 | Murzin et al. ............... | 118/723 |
| 6,055,928 | 5/2000 | Murzin et al. ............... | 118/723 |
| 6,069,682 * | 5/2000 | Ishikawa ................. | 335/47 |

FOREIGN PATENT DOCUMENTS

362018044 * 1/1987 (JP) ...................................... 438/762

OTHER PUBLICATIONS

Application No. 08/858,004, filed May 16, 1997, entitled: Chemical Vapor Deposition of Metals on a Spherical Shaped Semiconductor Substrate by Akira Ishikawa, copy of abstract and figure No. one.

Application No. 09/033,180, filed Mar. 2, 1998, entitled: Inductively Coupled Plasma Power Vaporization for Fabricating Integrated Circuits, by Ivan Herman Murzin and Ram K. Ramamurthi, copy of abstract and figure no. one.

Application No. 09/032,965, filed Mar. 2, 1998, entitled: Plasma Immersion Ion Processor for Fabricating Semiconductor Integrated Circuits by Ivan Herman Murzin and Yanwei Zhang, copy of abstract and figure no. one.

Application No. 09/069,645, filed: Apr. 29, 1998, entitled: Plasma–Assisted Metallic Film Deposition by Changfeng Xia, copy of abstract and figure no. one.

* cited by examiner

*Primary Examiner*—Caridad Everhart
(74) *Attorney, Agent, or Firm*—Haynes and Boone, LLP (57) ABSTRACT

A method and system for chemical vapor deposition (MO CVD) of a metal layer upon a spherical substrate at atmospheric pressure are disclosed. The method performs chemical vapor deposition of a metal layer such as aluminum or copper upon the semiconductor spherical substrate by using a reactor made of a material such as quartz. The semiconductor spherical substrate moves and spins through the reactor where it is heated by a frequency heater such as an infrared heater. The heater utilizes infrared power source operating at a wavelength between 1 and 3 microns where the power is substantially absorbed by the semiconductor spherical substrate and is substantially transmitted by the quartz.

38 Claims, 7 Drawing Sheets

CHEMICAL VAPOR DEPOSITION OF METALS ON A SPHERICAL SHAPED SEMICONDUCTOR SUBSTRATE

CROSS REFERENCE

This application is a continuation-in-part of U.S. patent Ser. No. 09/113,671 filed Jul. 10, 1998.

BACKGROUND OF THE INVENTION

Conventional integrated circuits, or "chips," are formed from a flat surface semiconductor wafer. The semiconductor wafer is typically manufactured in a semiconductor material manufacturing facility and then provided to an integrated circuit fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

With respect to a conventional semiconductor manufacturing and fabrication facility, the facility is relatively expensive to operate due to the enormous effort and expense required for creating flat silicon wafers and chips. For example, manufacturing of wafers requires several high-precision steps including creating rod-form single crystal semiconductor material; precisely cutting ingots from the semiconductor rods; cleaning and drying the cut ingot sections; manufacturing a large single crystal from the ingots by melting them in a quartz crucible; grinding, etching, and cleaning the surface of the crystal; cutting, lapping and polishing wafers from the crystal; and heat processing the wafers. Moreover, the wafers produced by the above processes typically have many defects which are largely attributable to the difficulty in making a single, highly pure crystal due to the above cutting, grinding and cleaning processes as well as due to various impurities, including oxygen, associated with containers used during the forming of the crystals. These defects become more and more prevalent as feature sizes of integrated circuits formed on these wafers become smaller.

Another major problem associated with modern fabrication facilities for flat chips is that they require extensive and expensive equipment. For example, dust-free clean rooms and precisely-controlled manufacturing and storage areas are necessary to prevent the wafers and chips from defecting and warping. Also, these types of fabrication facilities suffer from a relatively inefficient throughput as well as an inefficient use of the silicon. For example, facilities using in-batch manufacturing, where the wafers are processed by lots, must maintain huge inventories to efficiently utilize all the equipment of the facility. Also, because the wafers are round, and the completed chips are rectangular, the peripheral portion of each wafer cannot be used.

Still another problem associated with modern fabrication facilities is that they do not produce chips that are ready to use. Instead, there are many additional steps that must be completed, including cutting and separating chips from the wafer; assembling each chip to a lead frame which includes wire bonding, plastic or ceramic molding and cutting and forming the leads, positioning assembled chip onto a printed circuit board; and mounting the assembled chips to the printed circuit board. The cutting and assembly steps introduce many errors and defects due to the precise requirements of such operations. In addition, the positioning and mounting steps are naturally two-dimensional in character, and therefore do not support curved or three dimensional areas.

Therefore, due to these and various other problems, only a few companies in the world today can successfully manufacture conventional flat chips. Furthermore, the chips must bear a high price to cover the costs of manufacturing, as well as the return on initial capital and investment.

In addition to the above, one technology which may be used during semiconductor chip manufacturing includes chemical vapor deposition (CVD) technology. Existing chemical vapor deposition (CVD) technology uses low pressure in a vacuum processing chamber to form a metal layer, e.g., copper or aluminum, on large diameter silicon wafers. A low pressure is required for obtaining a uniform layer over the wafer surface, since the wafer surface resides in the same position during deposition of the metal layer. In addition, vacuum sputtering processes are traditionally used in the semiconductor industry for making metal interconnects.

In co-pending U.S. patent application Ser. No. 08/858,004 filed on May 16, 1997, entitled "Spherical Shaped Semiconductor Integrated Circuit" and assigned to the same assignee as the present application, incorporated herein by reference, a method and system for manufacturing spherical-shaped semiconductor integrated circuit devices is disclosed. The manufacturing of spherical shaped semiconductor integrated circuit devices as disclosed in U.S. patent Ser. No. 08/858,004 involves a continuous atmospheric semiconductor IC manufacturing process. As a result, deposition of metals using low pressure CVD techniques, as disclosed in the art with respect to flat semiconductor substrates, is incompatible for use in the manufacture of spherical shaped semiconductor substrate. An atmospheric CVD process for coating spherical shaped semiconductor substrates and integrated circuits would thus be desirable.

U.S. patent Ser. No. 09/113,671 filed Jul. 10, 1998, assigned to the same assignee as the present application and incorporated herein by reference, provides a method for metal-organic chemical vapor deposition (MO CVD) of a metal layer upon a spherical substrate at atmospheric pressure. A spherical substrate is pretreated with a vapor of a first precursor in preparation for a deposition of a metal layer. The step of pretreating the spherical substrate includes exposing the surface of spherical substrate to the first precursor vapor to form nucleation sites for a subsequent metal deposition, the first precursor including a liquid tetrakisdimethylamino-titanium (TDMAT) precursor. This step may also be described as a chemical vapor deposition of titanium nitride (TiN CVD). The pretreated spherical substrate is then exposed to a thermally dissociated precursor of metal for depositing the metal layer onto the spherical substrate. The exposure to the thermally dissociated precursor of metal provides a uniformly deposited metal layer coverage over the pretreated spherical substrate, wherein the step of exposing the pretreated spherical substrate further includes using a thermally dissociated liquid dimethyl-aluminum hydride (DMAH) precursor. This step may also be described as a chemical vapor deposition of aluminum (Al CVD). Next, the deposited metal layer is then annealed and cooled.

Although the above described method for MO CVD works well for its intended purpose, it has drawbacks associated with a continuous, pipelined fabrication operation. Specifically, the thermally dissociated precursor of metal for depositing the metal layer onto the spherical substrate also deposits a metal layer on the chamber used to perform this operation. As a result, the chamber must be cleaned on a periodic basis.

What is desired is a method for MO CVD that reduces the deposits of metal on the chamber, thereby requiring less frequent cleaning.

Further, what is desired is a method for MO CVD that readily accommodates copper (Cu) deposition (Cu CVD).

SUMMARY OF THE INVENTION

The present embodiments include a method and system for depositing thin films on the surface of spherical shaped semiconductor substrates. In one embodiment, the method performs chemical vapor deposition of a metal layer upon the semiconductor spherical substrate by using a reactor made of a material such as quartz ($SiO_2$). The semiconductor spherical substrate moves through the reactor where it is heated by a heater such as an infrared heater. The heater utilizes an infrared power source operating at a wavelength where the power is substantially absorbed by the semiconductor spherical substrate and is substantially transmitted by the quartz. For example, the wavelength may be between 1 and 3 microns.

In another embodiment, the metal layer includes one of either aluminum or copper. Also, the semiconductor spherical substrate may spin inside the reactor to facilitate the metal deposition.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, in which.

DETAILED DESCRIPTION OF THE PREFERRED EMBODIMENTS

Figure 1:
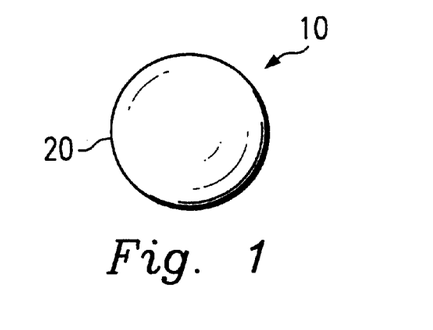
FIG. 1 shows an exemplary spherical shaped semiconductor substrate, also referenced herein as a spherical semiconductor substrate.

In accordance with the present disclosure, a metal-organic chemical vapor deposition (MO CVD) system and method are provided for forming a metal film layer on a spherical semiconductor substrate in an atmospheric process. FIG. 1 shows an exemplary spherical semiconductor substrate 10. Spherical semiconductor substrate 10 is on the order of a one millimeter (1 mm) diameter spherical substrate, however, other diameters are possible.

Figure 2:
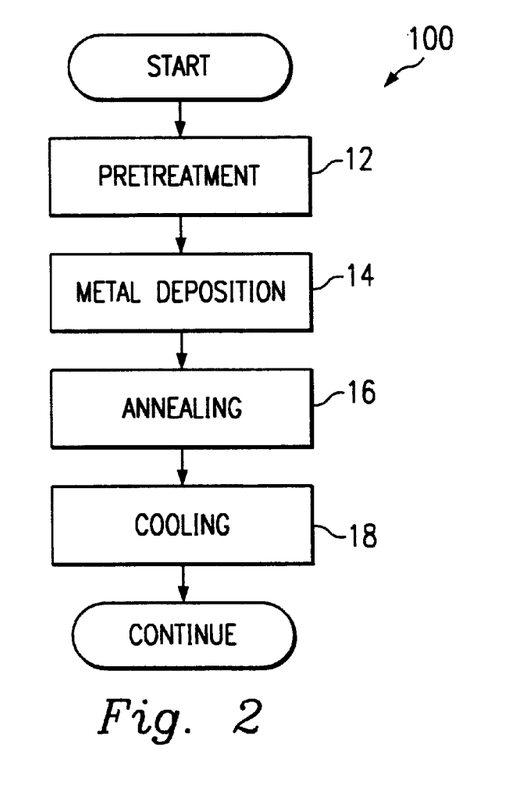
FIG. 2 illustrates in flow diagram form, an embodiment of the method for atmospheric CVD of a metal layer on a spherical semiconductor substrate according to the present disclosure.

Referring now to FIGS. 1 and 2, the MO CVD system and method 100 of the present disclosure includes pre-treatment 12, metal deposition 14, annealing 16, and cooling 18 processing steps as will be discussed further herein below. In addition, according to the MO CVD system and method 100 of the present disclosure, various prescribed gas streams are used to transport the spherical semiconductor substrate 10 throughout quartz tubes of a quartz reactor, the quartz tubes being used to interconnect the various processing stages or steps. Gas streams are also used between and during the series of processing steps. For example, gas streams are used to suspend the spherical semiconductor substrate 10 in each of a series of processing positions according to the particular series of processing steps as will be discussed herein below. In particular, for treatment at a particular processing step, a processing position is maintained with the use of a prescribed gas stream or streams in conjunction with a cone-shaped holding fixture, to be discussed further herein below.

With reference still to FIGS. 1 and 2, in one preferred embodiment, the metal film layer to be deposited upon the spherical substrate 10 includes aluminum. In the first step 12, with respect to the CVD deposition of an aluminum film layer, the surface 20 of the spherical semiconductor substrate 10 is pretreated by being exposed to a vapor of tetrakisdimethylamino-titanium (TDMAT) precursor to form nucleation sites for a subsequent aluminum deposition process. Pretreatment occurs at room temperature or may alternatively occur at an elevated temperature. Next in step 14, during metal deposition, a dimethyl-aluminum hydride (DMAH) precursor is thermally dissociated on the spherical semiconductor substrate surface 20, providing a uniform aluminum coverage over the pre-treated spherical substrate 10. The MO CVD method concludes with an annealing step 16, followed by a controlled cooling step 18. The metal coated spherical substrate 10 is then transported to a subsequent processing step to continue the manufacture of a spherical semiconductor integrated circuit according to a desired process and design. In an alternate embodiment, the pretreatment step 12 and metal deposition step 14 can be carried out using a direct liquid injection system, to be discussed further herein below with respect to FIGS. 6 and 7.

Figure 3:
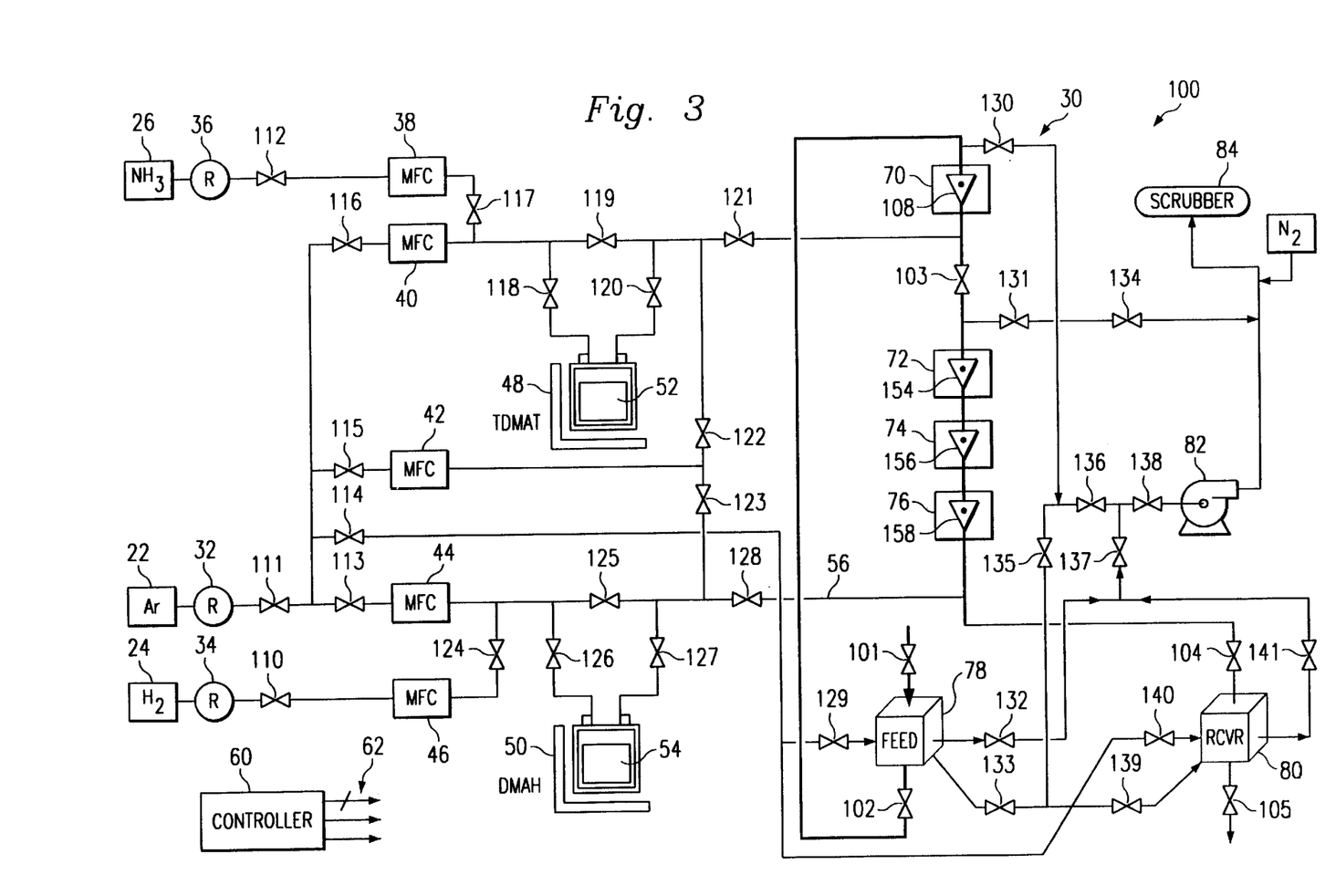
FIG. 3 illustrates an embodiment of the atmospheric CVD system for deposition of a metal layer on a spherical semiconductor substrate according to the present disclosure.

Referring now to FIG. 3, the MO CVD system 100 according to the present disclosure will now be described in further detail. Gas sources 22, 24 are provided for supplying gas which is to be used in transporting the spherical substrate 10 through the various processing steps of the present method. The gas sources 22 and 24 include argon (Ar), and hydrogen ($H_2$), respectively. An additional gas source 26 of $NH_3$ is provided, also. Various manual and air actuated pneumatic valves, identified with reference numerals 110–141, are used in a series of interconnected tubing for providing the necessary gas flows to the quartz reactor 30 of the present MO CVD system 100. Regulators 32, 34 and 36 are provided at a corresponding gas source for regulating a flow of gas from the particular source. Mass flow controllers 38, 40, 42, 44, and 46 are also provided for use in controlling the rate of flow of a particular gas. For example, gas regulators 32 and 34 are used to provide the carrier gases of either argon or hydrogen, or a mixture of both as controlled by mass flow controllers 40, 44 and 46 to a set of 48 and 50 containing the precursors. In one instance, argon gas can be used during a transport of a spherical substrate from one station to the next. In addition, argon and/or hydrogen may be used during the cooling step to cool the spherical substrate as discussed herein.

In one embodiment of the present method and system, a first source of precursor 52 is provided for use during the pretreatment of the spherical substrate 10. The first source of precursor 52 includes the use of a bubbler 48, wherein the bubbler 48 contains the prescribed precursor 52. Similarly, a second source of precursor 54 includes the use of a bubbler 50. Bubblers are commercially available and thus only briefly described herein. The bubbler generally includes a stainless steel containing, the container having the prescribed liquid precursor inside. The bubbler further includes an IN valve 118 and an OUT valve 120. A carrier gas can be bubbled through the liquid precursor contained therein, thereby carrying precursor vapor out of the respective bubbler and onto the required processing station of the quartz reactor.

According to the present embodiments, carrier gas flow rates are controlled within the range of 0 to 1000 sccm flow rate interval. The gases can be routed directly to the quartz reactor 30 through appropriate valves. For example, if valve 119 is closed, then gases are routed into the bubbler 48 through valve 118 and come out of the bubbler 48 through valve 120. Bubbler 50 is operated in a similar manner. As discussed, when the gases "bubble" through the liquid precursor, the gases entail some of its vapor. The precursor vapor is dragged into the quartz reactor 30 in a flow of the carrier gas. With respect to the DMAH precursor of bubbler 50, a gas line 56 from the bubbler 50 to the quartz reactor 30 is heated with a heating tape or element (not shown) to a temperature on the order of 20–30° C. higher than that of the bubbler 50. The bubbler itself can be heated to increase the vapor pressure, and hence, the deposition rate of the precursor. For instance, the DMAH bubbler 50 can be heated up to a temperature in the range of 50–70° C. The gas delivery system as described is capable of establishing a reliable gas flow into the quartz reactor 30 and also of providing a constant prescribed delivery rate of the chosen chemical.

The MO CVD system 100 of the present disclosure further includes a controller 60. The controller 60 provides process control through various output control signals 62, for example, signals for controlling valves and gas flows according to a desired CVD processing for a particular spherical substrate 10. Controller 60 can include any suitable commercially available controller, computer, or the like. The controller 60 is programmed using programming techniques known in the art, to perform the functions as described herein with respect to carrying out the process steps of the present disclosure.

In accordance with the present disclosure, a quartz reactor 30 for use in MO CVD of a spherical substrate 10 includes a pretreatment station 70, a metal CVD station 72, a sintering (or annealing) station 74 and a cooling station 76. The quartz reactor 30 further includes a feeder unit 78 positioned upstream from the pretreatment station 70 for feeding spherical substrates 10 to be processed into the quartz reactor 30. In addition, a receiver unit 80 is also provided downstream from the cooling station 76 for receiving MO CVD processed spherical substrates. The MO CVD processed spherical substrates are released from the receiver unit 80 into a subsequent processing reactor (not shown) for further processing according to a particular spherical semiconductor integrated circuit manufacturing process.

The feeder unit 78 includes a spherical substrate input port 101 and a spherical substrate output port 102. Feeder unit 78 further includes a transport gas input 129 and a transport gas output 132. The feeder unit 78 is used to control the rate at which spherical substrates to be processed are admitted into the quartz reactor 30 (i.e., at a prescribed feed rate).

The receiver unit 80 is similar to the feeder unit 78, however, the receiver unit 80 controls the rate of flow of spherical substrates released from the quartz reactor. Receiver unit 80 includes a spherical substrate input port 104 and a spherical substrate output port 105. Receiver unit 80 also includes a transport gas input 140 and a transport gas output 141.

The feeder unit 78 and the receiver unit 80 further include gas lines which can be used for purging or exhausting of a respective unit as may be desired from time to time (e.g. for removal of reaction byproducts or other undesired gases and/or substances from inside a respective unit). A dry vacuum pump 82 is provided to assist with the exhausting of the feeder unit 78 and the receiver unit 80. The dry vacuum pump 82 also provides low background pressure prior to CVD processing of a spherical substrate. Exhausting of the feeder unit 78 and the receiver unit 80 is carried out as needed for obtaining a desired state and/or condition within the respective unit.

A central scrubber 84 is also provided at the exhaust of the quartz reactor 30. The central scrubber 84 absorbs and removes reaction byproducts and chemicals from the reactor exhaust gas, wherein the byproducts and chemicals originate from the reactive process carried out within the quartz reactor 30. Nitrogen ($N_2$) gas 86 may also be supplied at the input of the scrubber 84 to assist with the scrubbing process. Scrubbers are typically known in the art, and thus only a brief description thereof has been provided herein.

Figure 4:
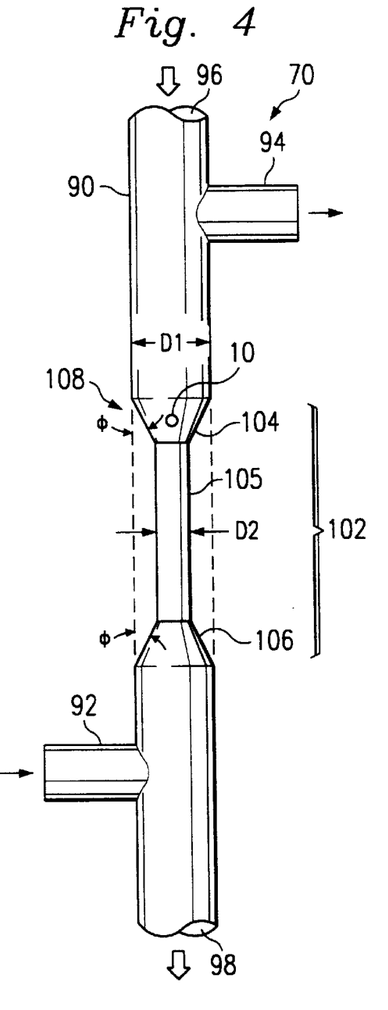
FIG. 4 illustrates, in further detail, one embodiment of a pretreatment component of the atmospheric CVD system of FIG. 3 according to the present disclosure.

Referring now to FIG. 4, the pretreatment station 70 of the quartz reactor 30 of the present disclosure shall be further described. The pretreatment station 70 includes a vertically disposed main section of tubing 90, preferably quartz tubing. A gas inlet 92 is positioned proximate a lower portion of the quartz tubing 90 as shown. The gas inlet 92 is further disposed generally perpendicular to the orientation of the main section 90. In addition, a gas outlet 94 is positioned proximate an upper portion of the main section of the quartz tubing 90. The gas outlet 94 is disposed generally perpendicular to the orientation of the main section 90. The main section 90 further includes a spherical substrate input port 96 and a spherical substrate output port 98. The main section 90 still further includes a conically tapered, funnel or cone-shaped section 102 as follows. The main section of quartz tubing 90 has a first diameter D1. The conically tapered section 102 includes a first cone 104 in which the inner diameter of the tubing is reduced from diameter D1 to diameter D2, where D1 is greater than D2. In one embodiment the cone wall of the first cone 104 which facilitates the diameter D1 to D2 reduction is at an angle φ on the order of approximately 30° with the wall of the main section 90 of the tubing. The conically tapered section 102 further includes a second cone 106 in which the inner diameter of the tubing is enlarged from diameter D2 to diameter D1. In addition, in one embodiment, the cone wall of the second cone 106 is sloped at an angle φ on the order of 30° with respect to the side wall of the main section of the tubing 90. Note that angles other than 30° may be suitable also. Extending between the first cone and the second cone is an intermediate tube section 105 having a diameter on the order of D2. Diameters D1 and D2 are larger than the diameter of the spherical substrates to be processed. Length dimensions of respective portions of the tubing and conical-tapered section of the pretreatment station 70 are selected to obtain a desired substrate transport, in combination with flow rates of transport gases.

During pretreatment (step 12 of FIG. 2), gas containing precursor vapor is input into the gas inlet 92 at a particular rate sufficient to maintain the spherical substrate 10 to be processed in a holding position within or proximate to the first cone 104. The area within or proximate to the first cone 104 can be referred to as the cone-shaped spherical substrate holder 108, as discussed herein. For pretreatment processing, a spherical substrate 10 to be processed enters the substrate inlet port 96 of the pretreatment station 70. The substrate 10 then proceeds to the cone-shaped spherical substrate holder 108. While positioned at the substrate holder 108, the substrate 10 is pretreated according to a desired pretreatment. In a preferred embodiment, the pre-treatment step 12 (FIG. 2) includes exposing the substrate 10 to a vapor of TDMAT to form nucleation sites for a subsequent aluminum deposition process for a duration on the order of 10 seconds to one minute. Subsequent to a given pretreatment, the substrate 10 then proceeds through the intermediate tube section 105 of the conically tapered section 102 and is then released (i.e., exits) from the pretreatment station 70 via the spherical substrate outlet port 98. Suitable control of the gas flow through the pretreatment station 70 by controller 60 (FIG. 3) enables the substrate to descend as needed. That is, the rate of descent of a spherical substrate 10 through the pretreatment station 70 is controlled via the flow rate of transport gas and/or pretreatment gas which is flowed into the gas inlet 92 and out of the gas outlet 94, as controlled by controller 60. Release of the spherical substrate 10 from the pretreatment station 70 is accomplished by the opening of the substrate valve 103 (FIG. 3) disposed between the pretreatment station and the metal CVD station 72. Opening of the substrate valve 103 produces a pressure drop, thus causing the substrate 10 to descend from the pretreatment station 70 into the metal CVD station 72. During pretreatment of the spherical substrate 10, the substrate inlet port 96 and substrate outlet port 98 are closed off using corresponding substrate valves 102 and 103, respectively.

Figure 5:
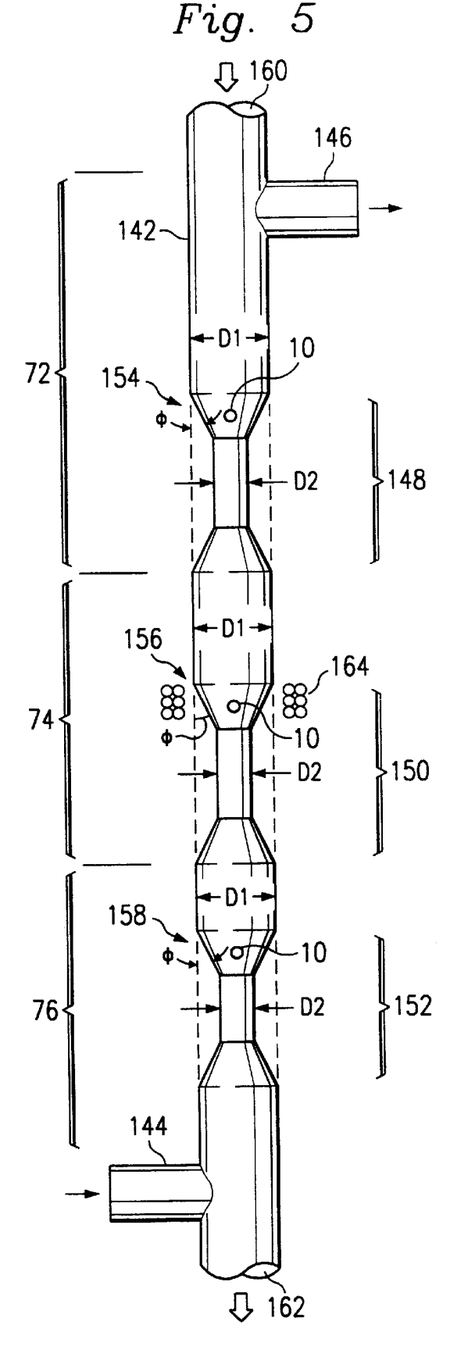
FIG. 5 illustrates, in further detail, one embodiment of the metal deposition/annealing/cooling component of the atmospheric CVD system of FIG. 3 according to the present disclosure.

Referring now to FIG. 5, a second portion of the quartz reactor 30 for the MO CVD system 100 of the present disclosure will now be discussed. As described with respect to FIG. 3, the second portion includes the metal CVD station 72, the sintering (i.e., annealing) station 74, and the cooling station 76. The second portion includes a vertically disposed main section of tubing 142, preferably quartz tubing. A gas inlet 144 is positioned proximate a lower portion of the quartz tubing 142 as shown. The gas inlet 144 is further disposed generally perpendicular to the orientation of the main section 142. In addition, a gas outlet 146 is positioned proximate an upper portion of the main section 142 of the quartz tubing. The gas outlet 146 is disposed generally perpendicular to the orientation of the main section.

With reference still to FIG. 5, the main section 142 further includes first, second, and third conically tapered, funnel or cone shaped sections 148, 150, and 152, respectively, as follows. As with the pretreatment station 70, the main section 142 of the quartz tubing has a first diameter of D1. Each conically tapered section 148–152 includes a first cone, a second cone, and an intermediate section. The first cone is characterized by the inner diameter of the quartz tubing being reduced from diameter D1 to a diameter D2, where D1 is larger than D2. With respect to the second cone, the inner diameter of the tubing is enlarged from diameter D2 to diameter D1. The intermediate section is characterized by a diameter on the order of diameter D2. In addition, the cone walls can be sloped, for example, at an angle φ on the order of 30° or other suitable angle with respect to the side wall of tubing of the main section 142, similar to that as discussed with the conical tapered section 102 of the pretreatment station of FIG. 4.

During CVD deposition of metal (step 14 of FIG. 2) onto the spherical substrate 10, gas containing the metal precursor vapor is input into the gas inlet 144 at a particular rate sufficient to maintain the spherical substrate 10 to be processed in a holding position within or proximate to the first cone 154 in the metal deposition station 72 of the quartz reactor 30. In a preferred embodiment, the metal precursor vapor includes DMAH precursor 54 (FIG. 3) for providing a uniform aluminum coverage over the pretreated spherical substrate 10. The metal precursor vapor is provided by a prescribed carrier gas bubbling through the source DMAH liquid 54 contained in the bubbler 50 of FIG. 3. A metal deposition can be carried out for a duration on the order of 30 seconds to two (2) minutes, or as required for a desired deposition. In addition, the DMAH precursor 54 is thermally dissociated to provide a uniform aluminum coverage over the pre-treated spherical substrate 10. The temperature range for the DMAH dissociation is from about 200 to 300° C. An argon (Ar) gas 22 flow rate for metal CVD deposition processing is established on the order of 250 sccm (standard cubic centimeters per minute). Hydrogen ($H_2$) gas 24 may also be used in a mixture with argon (Ar) as a carrier gas, resulting in a more pure deposited film.

As with the pretreatment station 70, the first cone 154 of the metal deposition station 72 is also referred to as a cone-shaped spherical substrate holder. The sintering station 74 and the cooling station 76 each also include cone-shaped spherical substrate holders, 156 and 158, respectively, as shown in FIG. 5.

Subsequent to a given MO CVD deposition at deposition station 72, the substrate 10 is then caused to proceed or descend through the intermediate tube section of the conically tapered section 148 of the metal deposition station 72. The rate of descent of the spherical substrate 10 through the metal deposition station 72 is controlled via the flow rate of the gases which are input through the gas input port 144 and output through the gas output port 146. During metal deposition, the spherical substrate input port 160 and spherical substrate output port 162 of the second portion of the quartz reactor 30 are closed off via corresponding substrate flow control valves 103 and 104, respectively.

Referring still to FIG. 5, following a metal deposition in the metal deposition station 72, the spherical substrate 10 descends to the cone-shaped spherical substrate holder 156 of the sintering or annealing station 74. The sintering station 74 includes a heating device or furnace 164 disposed proximate the cone-shaped spherical substrate holder 156. The heating device or furnace 164 provides a prescribed heating of the substrate 10 as required. In a preferred embodiment, sintering (step 16 of FIG. 2) occurs at temperatures in the range of about 350–450° C. for a given time duration, for example, on the order of about 30 minutes. Sintering or annealing is carried out for the purpose of electrically activating the deposited metal coating or aluminum film, to heal any damage in the aluminum film, and to decrease the resistance of the deposited film.

Heating device or furnace 164 includes any suitable heating element or elements, for example, a heating coil disposed in a wrapped fashion about the quartz tubing 142. That is, the heating device 164 is positioned in a manner suitable for heating the region of the quartz reactor 30 which encloses the spherical substrate 10, to heat the spherical substrate 10 to a desired temperature during sintering. Control of the heating device is handled by suitable control signals 62 of the controller 60. Upon a desired sintering of the substrate 10 in the sintering station 74, the substrate 10 is allowed to descend to the cooling station 76. Descent of the substrate 10 is controlled by appropriate adjustments in the gas flow into and out of the second portion of the quartz reactor 30 via gas inlet 144 and gas outlet 146.

With reference still to FIG. 5, the substrate 10 is transported from the sintering station 74 to the cooling station 76 as follows. The substrate 10 descends to the cone-shaped spherical substrate holder 158 of the cooling station 76. While in the substrate holding position, gas is allowed to flow past the substrate 10, effectively cooling the substrate as needed to obtain a desired cooling (step 18 of FIG. 2). In a preferred embodiment, the heat conductivity of the cooling gas is used to cool the substrate 10 to a temperature on the order of 25–50° C. or room temperature, for a given time duration, for example, on the order of five (5) minutes. Upon completion of cooling, the substrate 10 is allowed to descend out of the substrate output port 162 of the second portion and into the spherical substrate receiver 80 (FIG. 3). As mentioned herein above, the substrate receiver 80 controls the rate of flow of processed spherical substrates out of the quartz reactor 30 and on to further processing steps according to the particular requirements of a given spherical substrate integrated circuit design. In connection with the second portion of reactor 30, length dimensions of respective portions of the tubing and conical-tapered sections of the metal deposition, sintering, and cooling stations 72, 74, and 76, respectively, are selected to obtain a desired substrate transport, in combination with flow rates of transport gases.

In the MO CVD system 100 of the present disclosure, conventional materials can be used to construct the same. For example, the gas delivery lines can be made of stainless steel. In addition, the reactor tubes are preferably made of quartz, however, other suitable materials may be used.

In an alternate embodiment, ammonia ($NH_3$) 26 (FIG. 3) can be used as a reducing agent in addition to the TDMAT precursor 52. The ammonia and TDMAT are used to form a titanium nitride layer on the silicon surface 20 of the spherical substrate 10 prior to the aluminum CVD deposition. Using a suitable furnace (not shown) in conjunction with the pretreatment station of FIG. 4, the titanium nitride layer is deposited onto the surface of the spherical substrate prior to the aluminum deposition. The titanium nitride deposition promotes an improved receptivity for the aluminum deposition. In other words, instead of the room temperature pretreatment of TDMAT precursor 52, ammonia and TDMAT heated to a temperature on the order of 300–400° C. can be used during a pretreatment to form a titanium nitride layer on the surface 20 of the silicon spherical substrate 10. Titanium nitride is a conductive layer, which makes it easier for aluminum to be nucleated onto the nitride rather than silicon or silicon oxide. Titanium nitride thus provides an improved seed another alternate embodiment, illustrated in FIG. 6, the layer than silicon or silicon dioxide.

Figure 6:
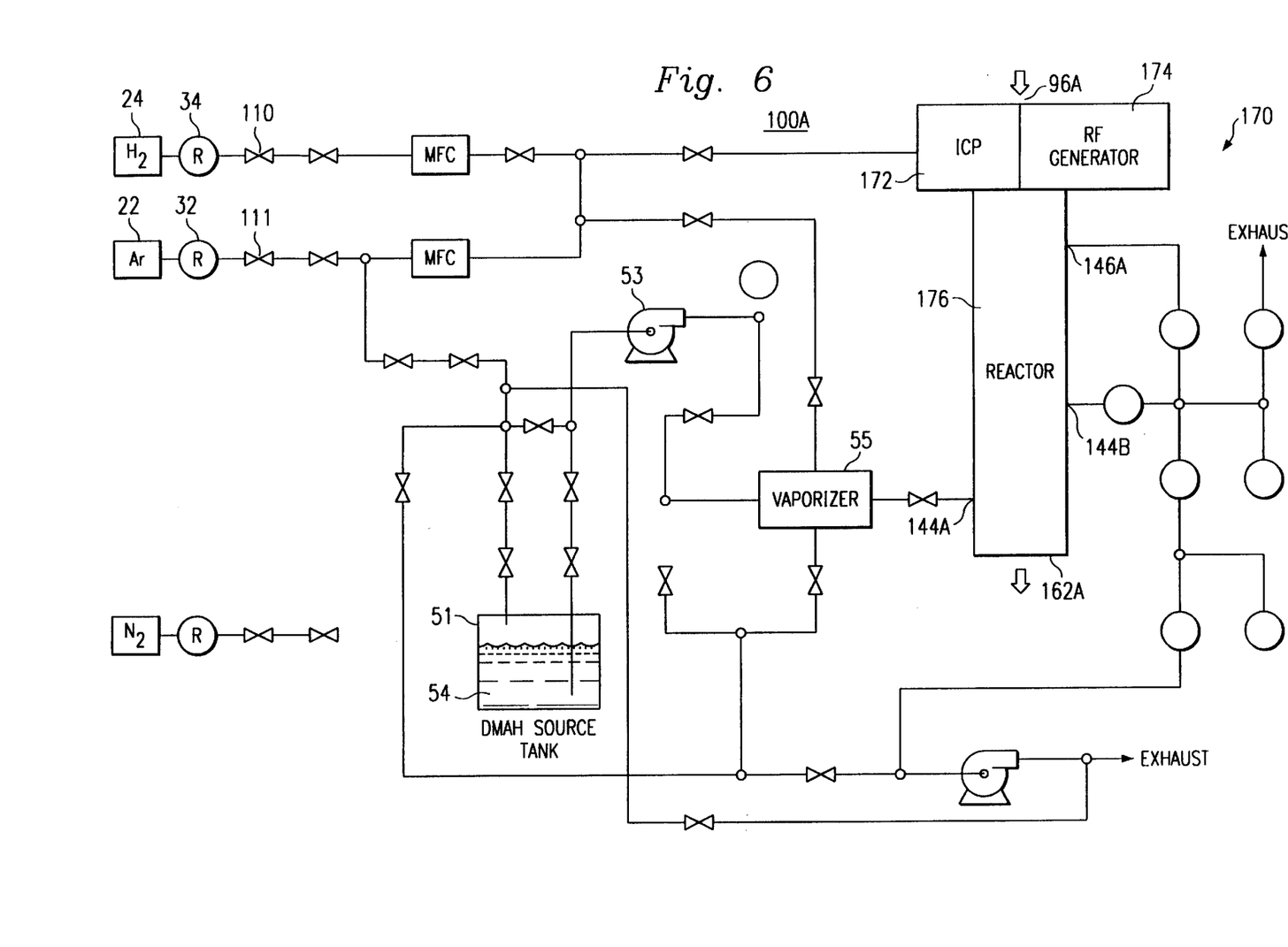
FIG. 6 illustrates, an alternate embodiment of the atmospheric CVD system according to the present disclosure, including a direct liquid injection system.

In yet atmospheric pressure MO CVD system 100A includes a reactor 170 having an inductively coupled plasma ("ICP") device 172 which is used as the pretreatment station 70A, as discussed herein. The MO CVD system 100A further includes a direct liquid injection system. The direct liquid injection system includes a source tank 51 of DMAH precursor 54, a pump 53, and a vaporizer 55. Vaporizer 55 may include any suitable vaporizer, such as commercially available from MKS Instruments. With the above, the ICP reactor 170 provides a means for pretreatment of the surface 20 of spherical substrate 10. The direct liquid injection system provides a means for aluminum CVD deposition on the pretreated substrate surface 20. ICP reactors are generally known in the art and thus only briefly described herein. The ICP reactor 170 is modified for appropriate handling of spherical substrates in a manner similar to that as shown and described with respect to FIGS. 4 and 5.

Figure 7:
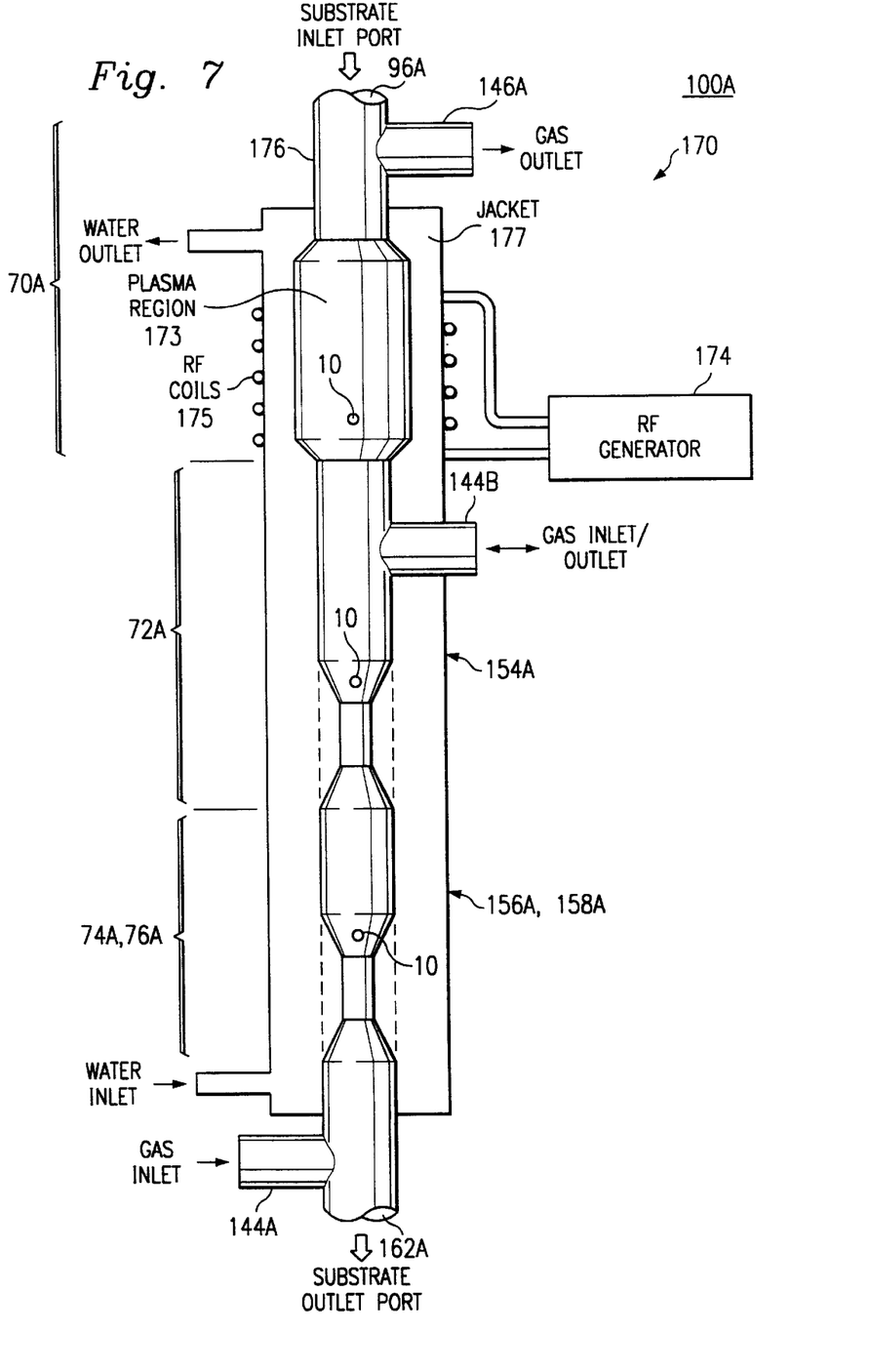
FIG. 7 illustrates, in further detail, the reactor component of the atmospheric CVD system of FIG. 6.

With reference still to the ICP reactor 170 of FIGS. 6 and 7, the spherical substrates 10 can be subjected to atmospheric inductively coupled plasma pretreatment. FIGS. 6 and 7 illustrate the set-up for an ICP Ar-$H_2$ surface pretreatment. The ICP reactor 170 includes an inductively coupled plasma torch 172 of known construction, an RF generator 174, matching network (not shown), and a control panel (not shown) which are utilized to produce an atmospheric plasma discharge. A water jacket 177 is used to enclose the plasma region 173 to avoid overheating. An inductance RF coil 175 is wrapped over the quartz tube region of larger diameter sufficient to ignite the plasma. An inductive coupling of the RF power supplied by the coil 175 to the carrier gas provides the plasma of a toroidal shape. A mixture of argon and hydrogen gases, typically Ar-4–5% $H_2$ is used to form the plasma. The plasma spreads out of the RF coil region throughout the tube length to the region where the spherical substrate 10 is suspended for pretreatment. The spherical substrate 10 is suspended in the discharge region of the plasma for a period of time sufficient for hydrogen passivation of the silicon surface of the spherical substrate. The plasma is created inside the quartz tubing of the quartz reactor 170. The spherical substrate 10 is held in the plasma region by regulating the flow of transport gases as appropriate.

With reference still to FIGS. 6 and 7, liquid precursor 54 is delivered from the source tank 51 via pump 53 to the vaporizer 55. The vaporizer 55 vaporizes the liquid precursor 54, which is then input into the reactor tube 176. The vaporizer 55 is proximate the reactor 170. Furthermore, vapor is formed by the vaporizer 55 immediately proximate the point of entry into the reactor tube 176. Atmospheric pressure liquid precursor vapor enters the ICP reactor 170 at gas input port 144A and is outport at gas output port 146A. The length dimensions of various portions of the tubing and conical-tapered sections of the reactor 170 of FIG. 7 for the pretreatment station 70A, CVD deposition station 72A, and sintering station 74A or cooling station 76A are chosen to obtain a desired substrate transport, in combination with flow rates of transport gases. During Al CVD deposition with the liquid precursor vapor (precursor 54), the spherical substrate 10 is positioned at the cone-shaped substrate holder 154A. During sintering, the spherical substrate 10 may be positioned at the cone-shaped substrate holder 156A. During cooling, the spherical substrate 10 can be positioned at the cone-shaped substrate holder 158A. An alternate gas inlet/outlet 144B may also be provided as necessary to obtain a desired gas flow.

In further discussion with respect to the delivery of a precursor vapor to the substrate to be processed during a given MO CVD processing step according to the present disclosure, two different methods have been discussed herein. One method 100 includes the use of bubblers and the other method 100A includes the use of direct liquid injection. In FIG. 3, the TDMAT precursor vapor is delivered using a bubbler. The TDMAT precursor vapor, however, may also be delivered using direct liquid injection, similarly as with the direct liquid injection of the DMAH precursor as shown in FIG. 6. With respect to the use of the bubbler, the carrier gas (e.g., Ar) goes through the liquid precursor and entails some vapor. For Al deposition, the vapor is then delivered into a heated zone, where the precursor thermally dissociates upon reaching the spherical substrate surface. Thermal dissociation provides a mechanism by which Al is being deposited upon the spherical silicon substrate surface. With respect to the use of direct liquid injection, the liquid precursor is pumped into a vaporizer, the vaporizer containing rotating disks, for example. The liquid precursor splashes upon the disk surfaces of the vaporizer and vaporizes, the vaporizer further including a heater. The vapor is then drawn into the reactor tube by a gas flow (e.g., Ar) going through the vaporizer and into the reactor tube. The vapor thermally dissociates on the spherical silicon substrate surface. The mechanism for vapor deposition on the spherical substrate is the same in both instances, however, the delivery method is either with the use of a bubbler or the use of direct liquid injection. Further with respect to the delivery methods, direct liquid injection is preferred, as it is a more advanced technique.

The present MO CVD systems and methods thus advantageously provide an atmospheric pressure CVD process for coating spherical shaped semiconductor substrates in the fabrication of spherical semiconductor integrated circuits. In this manner, the present MO CVD methods and systems overcome the problem discussed herein above with respect to the fact that no vacuum process is tolerated in the continuous, spherical integrated circuit manufacturing system, as disclosed in co-pending application Ser. No. 08/858,004. Lastly, the present MO CVD method and system advantageously provide a gaseous, chemical reaction based, all-CVD process which is highly useful in the continuous spherical semiconductor integrated circuit manufacturing process. Prior to the discovery of the MO CVD method and system of the present disclosure, no known atmospheric CVD process had been developed for the coating of spherical integrated circuits.

Further in accordance with the MO CVD method and system of the present disclosure, a manufacturing process and system are provided for atmospheric pressure thin film coating of spherically shaped semiconductor integrated circuits. During the manufacture of film layers on the surface of the spherical substrate, film layer uniformity is obtained through the spinning of the spherical substrate in the gaseous flows while at atmospheric pressure. In addition, since the spherical substrates are also transported by the use of gas streams, the entire manufacturing process is conducted at atmosphere. The present embodiments thus capitalize on the advantages of atmospheric gas phase reaction and suspension techniques. The present embodiments further allow for a novel method of depositing blanket metal films, in particular, aluminum, over small spherical semiconductor substrates.

With reference again to FIGS. 1 and 2, in an alternate embodiment, the MO CVD system and method 100 of the present disclosure deposits a metal film layer that includes copper (Cu) upon the spherical substrate 10. In the first step 12, with respect to the CVD deposition of a copper film layer, the surface 20 of the spherical semiconductor substrate 10 is pretreated by being exposed to a vapor of pentakisdimethylamino-tantalum (PDMAT) for a Ta precursor to form nucleation sites for a subsequent copper deposition process. This step may also be described as a chemical vapor deposition of tantalum nitride (TaN CVD). TaN CVD may occur at room temperature or at an elevated temperature.

Next in step 14, during metal deposition, a copper precursor, such as Cupra Select manufactured by Air Products and Chemicals, Inc. of Allentown, Pa., is thermally dissociated on the spherical semiconductor substrate surface 20, providing a uniform copper coverage over the pre-treated spherical substrate 10. This step may also be described as a chemical vapor deposition of copper (Cu CVD). Cu CVD occurs at an elevated temperature.

Figure 8:
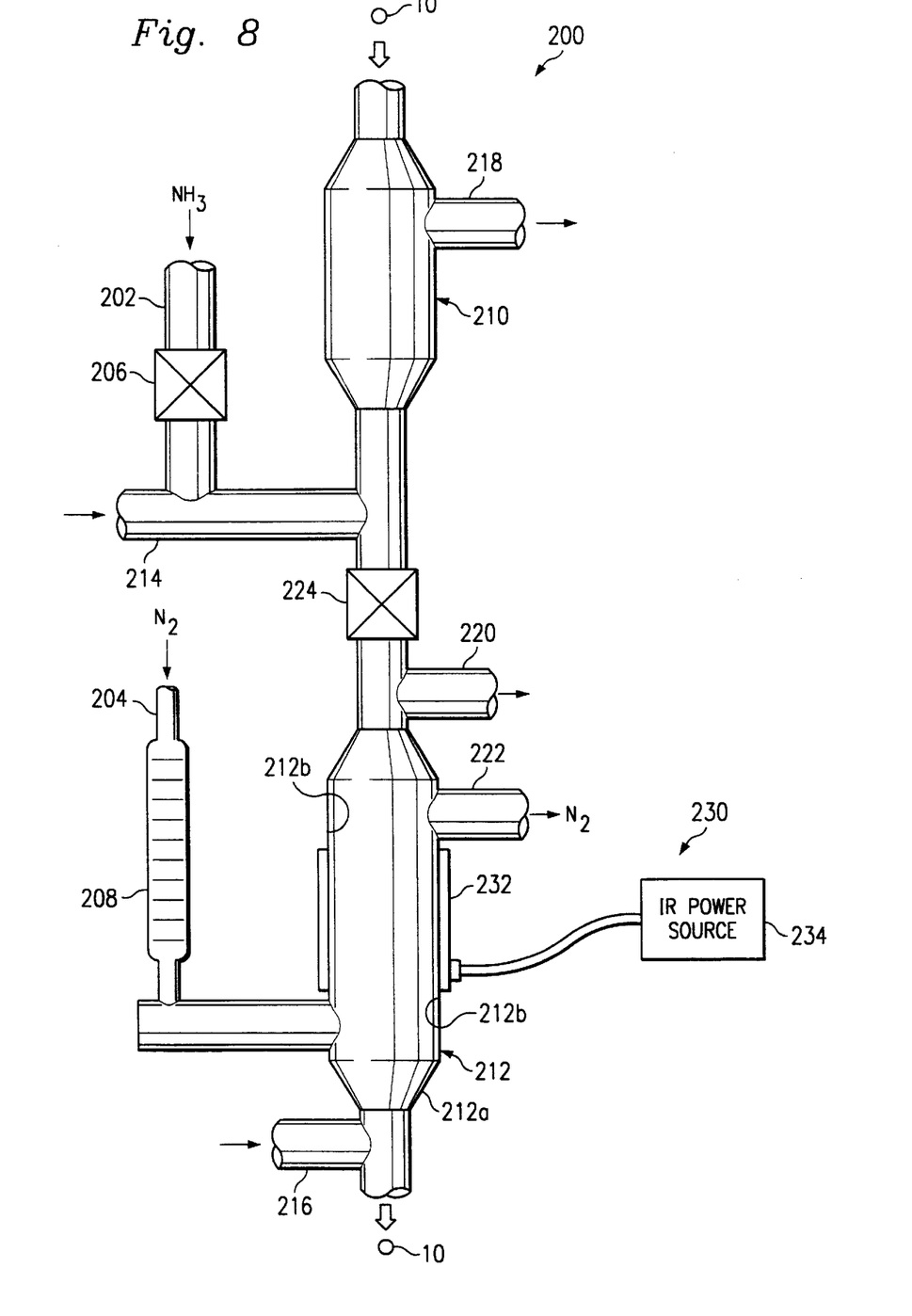
FIG. 8 illustrates yet another embodiment of an atmospheric CVD system according to the present disclosure, including a reactor.

Referring now to FIG. 8, an alternative MO CVD system 200 according to the present disclosure will now be described in further detail. Various gas sources, such as sources 202, 204, are provided for supplying gas which is to be used in transporting the spherical substrate 10 through the various processing steps of the present method. The gas sources 202 and 204 include ammonia ($NH_3$) and nitrogen ($N_2$), respectively. Argon (Ar) or other additional gases may also be provided. A pneumatic valve 206 and a flow meter 208 are used in a series of interconnected tubing for providing the necessary gas flows from the sources 202, 204, respectively. It is understood that other components, such as gas regulators and mass flow controllers, may also be used in the MO CVD system 200, but are left out of the drawing for the sake of clarity and simplicity.

Gases from the sources 202, 204 are provided to one or more reactors, represented by a first quartz reactor 210 and a second quartz reactor 212. Referring also to FIG. 2, the first quartz reactor 210 is used for performing the pretreatment (Ta CVD) step 12 while the second quartz reactor 212 is used for performing the metal deposition (Cu CVD) step 14.

In one embodiment of the present method and system, a first source of precursor 214 is provided for use during the pretreatment of the spherical substrate 10. The first source of precursor 214 may include a bubbler (not shown) for containing the prescribed precursor (PDMAT in the present example). Similarly, a second source of precursor 216 is provided for use during the metal deposition of the spherical substrate 10 (Cupra Select precursors in the present example).

The gases can be routed directly to the quartz reactors 210, 212 through appropriate tubes. For example, the PDMAT precursors 214 and ammonia 202 may be combined and provided to the quartz reactor 210, and eventually expelled through an exhaust pipe 218. Also, the Cupra Select precursors 216 may be provided to the quartz reactor 212 via an Argon bubbler (not shown) and eventually expelled through an exhaust pipe 220. The nitrogen 204 may be provided in an circumferential cavity of the reactor 212 and expelled through an exhaust pipe 222, thereby cooling the reactor 212 during heated operations. A valve 224 may also be placed between the two reactors 210, 212. If the valve 224 is open, then gases and or products may flow there between.

The quartz reactor 212 is heated by an infra-red (IR) heater 230. The heater 230 includes an IR radiator 232 and an IR power source 234. In operation, the pre-treated spherical substrate 10 moves through the quartz reactor 212, spins in a conical shaped portion 212a of the reactor, is heated by the IR heater 230, and is deposited with the Cu precursors 216.

In order to reduce the amount of deposit that builds on the walls 212b of the quartz reactor 212, the IR power source 234 operates at a specialized frequency. The specialized frequency is such that the output intensity of the IR power is highly absorbed by the pre-treated spherical substrate 10 but is not highly absorbed by the walls 212b of the quartz reactor. Because the walls 212b of the quartz reactor are not substantially heated, and is further cooled by the gas source 204, very little of the Cu precursors 216 will gather on the walls.

Figure 9:
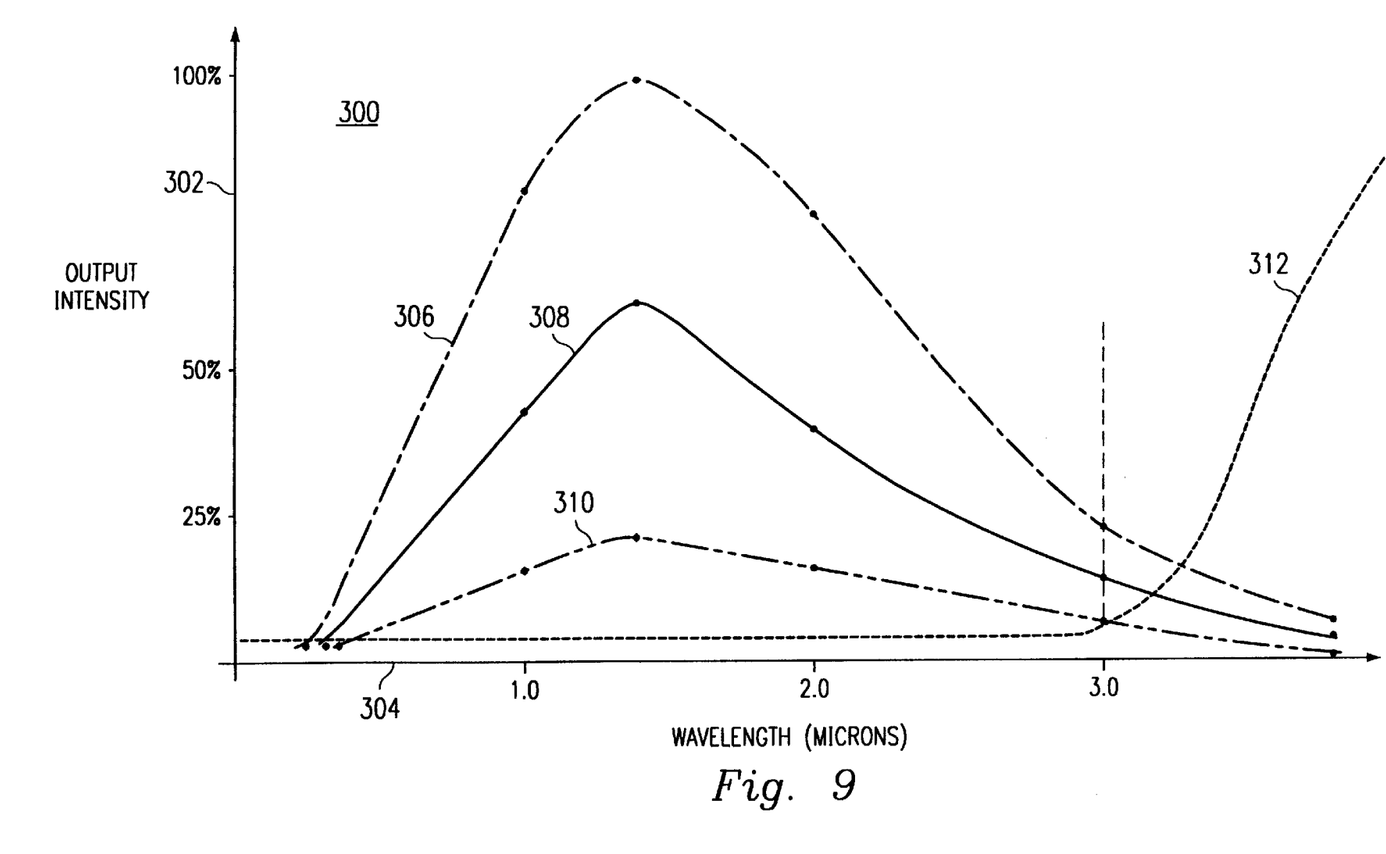
FIG. 9 illustrates a graph of energy absorbed by the substrate and reactor versus IR wavelength signal.

Referring to FIG. 9, a graph 300 can be used to select the specialized frequency for the output signal from the IR power source 234. A vertical axis 302 designates output intensity of the IR power. Output intensity represents the amount of power absorbed, and is inversely proportional to transmission. A horizontal axis 304 designates wavelength of the output signal from the IR power source 234 and is inversely proportional to frequency.

For the sake of example, four curves are plotted on the graph 300. A first curve 306 designates the amount of power absorbed by the pre-treated spherical substrate 10 when the IR power source 234 is operating at its rated voltage (about 480V). A second curve 308 designates the amount of power absorbed by the pre-treated spherical substrate 10 when the IR power source 234 is operating at ¾ the rated voltage. A third curve 310 designates the amount of power absorbed by the pre-treated spherical substrate 10 when the IR power source 234 is operating at ½ the rated voltage. A curve 312 designates the amount of power absorbed by the quartz reactor 212.

The graph 300 shows that, at a wavelength of less than 3 microns, a significant portion of the IR power is absorbed by the pre-treated spherical substrate 10, yet only a small portion is absorbed by the quartz reactor 212.

The present embodiment thus advantageously provides an improved heating source for use in the chemical vapor deposition of metals, such as Cu, Al, TiN, or TaN, on a semiconductor substrate. The heating source can be used at various temperatures and pressures and in different processing arrangements, such as those described in FIGS. 3–7 or other arrangements not herein disclosed. The heating source heats the material being processed without significantly heating the furnace/reactor enclosure. Also, multiple devices may be processed either sequentially or simultaneously, thereby facilitating a pipe-line manufacturing process.

Therefore, although illustrative embodiments have been shown and described, other modifications, changes, and substitutions are intended in the foregoing disclosure. For example, the above described methods and systems can be used with a damascene process such as is disclosed in U.S. Pat. Nos. 5,801,094, 5,736,457, and 5,635,423. Accordingly, it is appropriate that the appended claims be construed broadly and in a manner consistent with the scope of the disclosure.

What is claimed is:

1. A system for performing chemical vapor deposition of a metal layer upon a semiconductor spherical substrate, the system comprising:
   means for pretreating the spherical-semiconductor substrate to form nucleation sites for metal deposition;
   a reactor made of a first material;
   means for moving the semiconductor spherical substrate through the reactor wherein metal is deposited upon the surface of the spherical-semiconductor substrate; and
   a heater for providing power at a predetermined frequency;
   wherein the predetermined frequency is such that the power is substantially absorbed by the semiconductor spherical substrate and is substantially transmitted by the first material.

2. A system for metal-organic chemical vapor deposition of a metal layer upon a surface of a spherical-semiconductor substrate, the system comprising:
   means for pretreating the spherical-semiconductor substrate to form nucleation sites for metal deposition;
   means for depositing the metal on the pretreated spherical-semiconductor substrate;
   means for annealing the metal layer deposited on the spherical-semiconductor substrate; and
   means for cooling the metal layer deposited on the spherical-semiconductor substrate.

3. The system of claim 2 wherein the spherical-semiconductor substrate is transported through the system by varying the flow rate of at least one gas.

4. The system of claim 3 further comprising a controller and associated valves for controlling gas flow rate.

5. The system of claim 2 wherein the means for pretreating the spherical-semiconductor substrate to form nucleation sites for metal deposition comprise:
   a tubing for receiving the spherical-semiconductor substrate, and having a gas inlet and a gas outlet; and
   a source of precursor for flowing in the inlet and out the outlet.

6. The system of claim 5 wherein the tubing has a section of reduced diameter.

7. The system of claim 5 wherein the tubing has a conically tapered section defined by a first tapered portion of the tubing, and a second tapered portion of the tubing, with a section of reduced diameter tubing extending between the first and second tapered portions.

8. The system of claim 5 wherein the source for precursor is a bubbler.

9. The system of claim 5 wherein the source for precursor is a direct liquid injection system.

10. The system of claim 5 wherein the precursor is tetrakisdimethylamino-titanium (TDMAT).

11. The system of claim 5 wherein the precursor is pentakisdimethylamino-tantalum (PDMAT).

12. The system of claim 2 wherein the means for depositing the metal on the pretreated spherical-semiconductor substrate comprise:
   a tubing for receiving the spherical-semiconductor substrate, and having a gas inlet and a gas outlet; and
   a source of precursor for flowing in the inlet and out the outlet.

13. The system of claim 12 wherein the tubing has a section of reduced diameter.

14. The system of claim 12 wherein the tubing has a conically tapered section defined by a first tapered portion of the tubing, and a second tapered portion of the tubing, with a section of reduced diameter tubing extending between the first and second tapered portions.

15. The system of claim 12 wherein the source for precursor is a bubbler.

16. The system of claim 12 wherein the source for precursor is a direct liquid injection system.

17. The system of claim 12 wherein the precursor is dimethyl-aluminum hydride (DMAH).

18. The system of claim 12 wherein the precursor is Cupra Select precursor.

19. A system for metal-organic chemical vapor deposition of a metal layer upon a surface of a spherical-semiconductor substrate, the system comprising:
   a tubing for receiving the spherical-semiconductor substrate and a source of precursor, for pretreating the spherical-semiconductor substrate to form nucleation sites for metal deposition;
   means for depositing the metal on the pretreated spherical-semiconductor substrate;

means for annealing the metal layer deposited on the spherical-semiconductor substrate; and means for cooling the metal layer deposited on the spherical-semiconductor substrate.

20. The system of claim 19 wherein the tubing has a gas inlet and a gas outlet for allowing the precursor to flow through the tubing.

21. The system of claim 19 wherein the tubing has a section of reduced diameter.

22. The system of claim 19 wherein the tubing has a conically tapered section defined by a first tapered portion of the tubing, and a second tapered portion of the tubing, with a section of reduced diameter tubing extending between the first and second tapered portions.

23. The system of claim 19 wherein the source for precursor is a bubbler.

24. The system of claim 19 wherein the source for precursor is a direct liquid injection system.

25. The system of claim 19 wherein the precursor is tetrakisdimethylamino-titanium (TDMAT).

26. The system of claim 19 wherein the precursor is pentakisdimethylamino-tantalum (PDMAT).

27. The system of claim 19 wherein the tubing is quartz.

28. A system for metal-organic chemical vapor deposition of a metal layer upon a surface of a spherical-semiconductor substrate, the system comprising:

means for pretreating the spherical-semiconductor substrate to form nucleation sites for metal deposition;

a tubing for receiving the spherical-semiconductor substrate and a source of precursor for depositing the metal on the pretreated spherical-semiconductor substrate;

means for annealing the metal layer deposited on the spherical-semiconductor substrate; and means for cooling the metal layer deposited on the spherical-semiconductor substrate.

29. The system of claim 28 wherein the tubing has a gas inlet and a gas outlet for allowing the precursor to flow through the tubing.

30. The system of claim 28 wherein the tubing has a section of reduced diameter.

31. The system of claim 28 wherein the tubing has a conically tapered section defined by a first tapered portion of the tubing, and a second tapered portion of the tubing, with a section of reduced diameter tubing extending between the first and second tapered portions.

32. The system of claim 28 wherein the source for precursor is a bubbler.

33. The system of claim 28 wherein the source for precursor is a direct liquid injection system.

34. The system of claim 28 wherein the precursor is dimethyl-aluminum hydride (DMAH).

35. The system of claim 28 wherein the precursor is Cupra Select precursor.

36. The system of claim 28 wherein the tubing is quartz.

37. The system of claim 28 wherein the means for annealing the metal layer deposited on the spherical-semiconductor substrate comprise a heating coil wrapped around the tubing.

38. A method for metal-organic chemical vapor deposition of a metal layer upon a surface of a spherical-semiconductor substrate, the method comprising:

pretreating the spherical-semiconductor substrate to form nucleation sites for metal deposition;

depositing the metal on the pretreated spherical-semiconductor substrate;

annealing the metal layer deposited on the spherical-semiconductor substrate; and cooling the metal layer deposited on the spherical-semiconductor substrate.

* * * * *